United States Patent
Volant et al.

(10) Patent No.: US 6,635,506 B2
(45) Date of Patent: Oct. 21, 2003

(54) METHOD OF FABRICATING MICRO-ELECTROMECHANICAL SWITCHES ON CMOS COMPATIBLE SUBSTRATES

(75) Inventors: Richard P. Volant, New Fairfield, CT (US); John C. Bisson, Poughkeepsie, NY (US); Donna R. Cote, Poughkeepsie, NY (US); Timothy J. Dalton, Ridgefield, CT (US); Robert A. Groves, Highland, NY (US); Kevin S. Petrarca, Newburgh, NY (US); Kenneth J. Stein, Sandy Hook, CT (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/014,660

(22) Filed: Nov. 7, 2001

(65) Prior Publication Data

US 2003/0148550 A1 Aug. 7, 2003

(51) Int. Cl.$^7$ .......................... H01L 21/00; G01P 15/08; G01L 1/22; H01H 57/00; H03K 17/975
(52) U.S. Cl. .......................... 438/52; 200/181; 200/600; 73/504.14; 73/514.16; 73/862.632
(58) Field of Search .............................. 438/50, 51, 52, 438/53; 73/514.16, 514.25, 504.15, 504.14, 862.632, 862.634; 200/600, 181

(56) References Cited

U.S. PATENT DOCUMENTS

| | | |
|---|---|---|
| 4,975,390 A | 12/1990 | Fujii et al. |
| 5,543,349 A | 8/1996 | Kurtz et al. |

(List continued on next page.)

OTHER PUBLICATIONS

"Erosion of Diamond Films and Graphite in Oxygen Plasma", A. Joshi et al., Journal of Materials Research, 1996, vol. 6, No. 7, p. 1484.

*Primary Examiner*—John F. Niebling
*Assistant Examiner*—Viktor Simkovic
(74) *Attorney, Agent, or Firm*—H. Daniel Schnurmann

(57) ABSTRACT

A method of fabricating micro-electromechanical switches (MEMS) integrated with conventional semiconductor interconnect levels, using compatible processes and materials is described. The method is based upon fabricating a capacitive switch that is easily modified to produce various configurations for contact switching and any number of metal-dielectric-metal switches. The process starts with a copper damascene interconnect layer, made of metal conductors inlaid in a dielectric. All or portions of the copper interconnects are recessed to a degree sufficient to provide a capacitive air gap when the switch is in the closed state, as well as provide space for a protective layer of, e.g., Ta/TaN. The metal structures defined within the area specified for the switch act as actuator electrodes to pull down the movable beam and provide one or more paths for the switched signal to traverse. The advantage of an air gap is that air is not subject to charge storage or trapping that can cause reliability and voltage drift problems. Instead of recessing the electrodes to provide a gap, one may just add dielectric on or around the electrode. The next layer is another dielectric layer which is deposited to the desired thickness of the gap formed between the lower electrodes and the moveable beam that forms the switching device. Vias are fabricated through this dielectric to provide connections between the metal interconnect layer and the next metal layer which will also contain the switchable beam. The via layer is then patterned and etched to provide a cavity area which contains the lower activation electrodes as well as the signal paths. The cavity is then back-filled with a sacrificial release material. This release material is then planarized with the top of the dielectric, thereby providing a planar surface upon which the beam layer is constructed.

15 Claims, 12 Drawing Sheets

U.S. PATENT DOCUMENTS

| | | | |
|---|---|---|---|
| 5,880,921 A | 3/1999 | Tham et al. | 361/233 |
| 5,937,274 A | 8/1999 | Kondow et al. | |
| 5,970,315 A | 10/1999 | Carley et al. | 438/52 |
| 6,048,774 A * | 4/2000 | Yamamoto et al. | 438/406 |
| 6,143,997 A | 11/2000 | Feng et al. | 200/181 |
| 6,160,230 A | 12/2000 | McMillan et al. | 200/181 |
| 6,396,368 B1 * | 5/2002 | Chow et al. | 333/262 |
| 6,440,766 B1 * | 8/2002 | Clark | 438/52 |

* cited by examiner

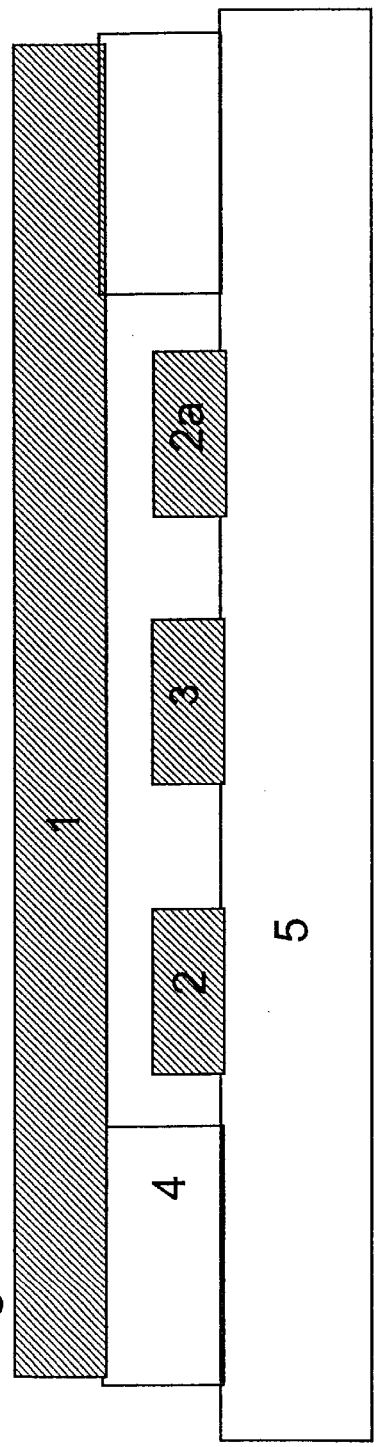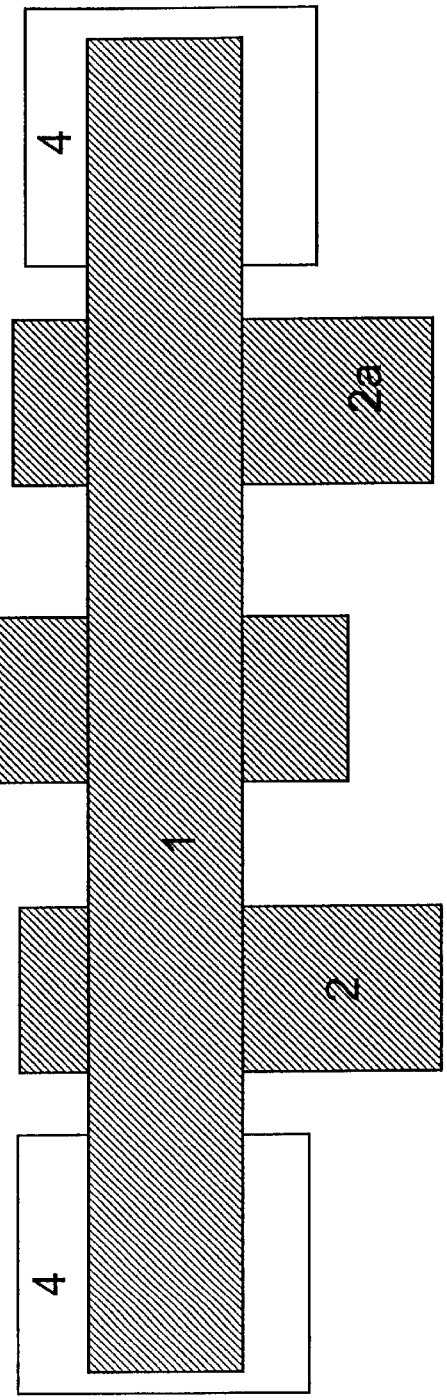

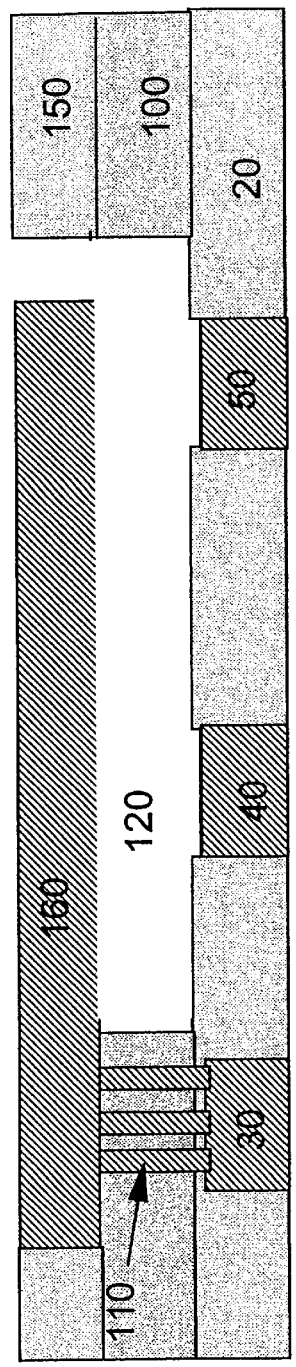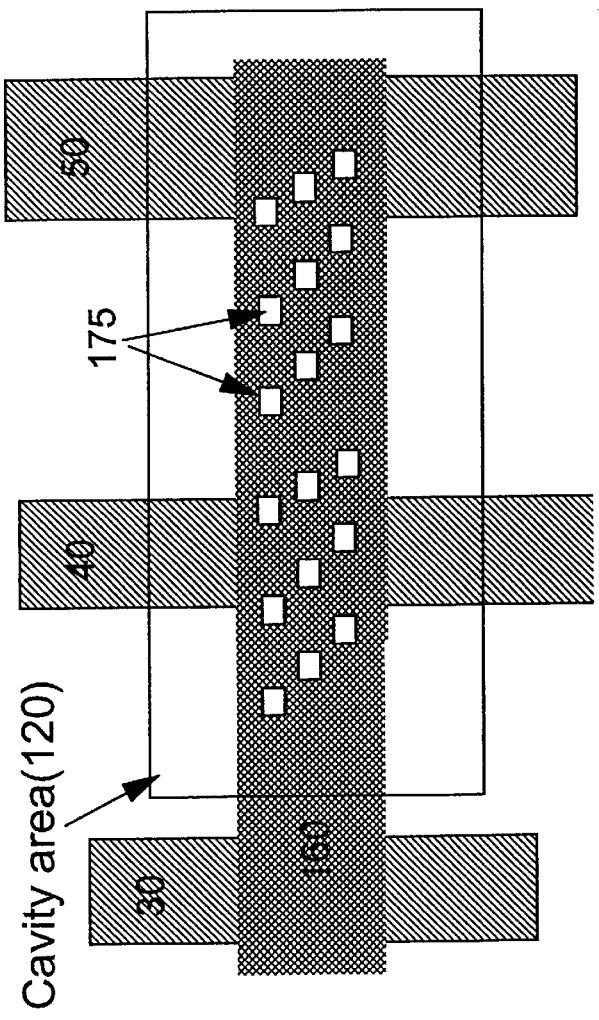

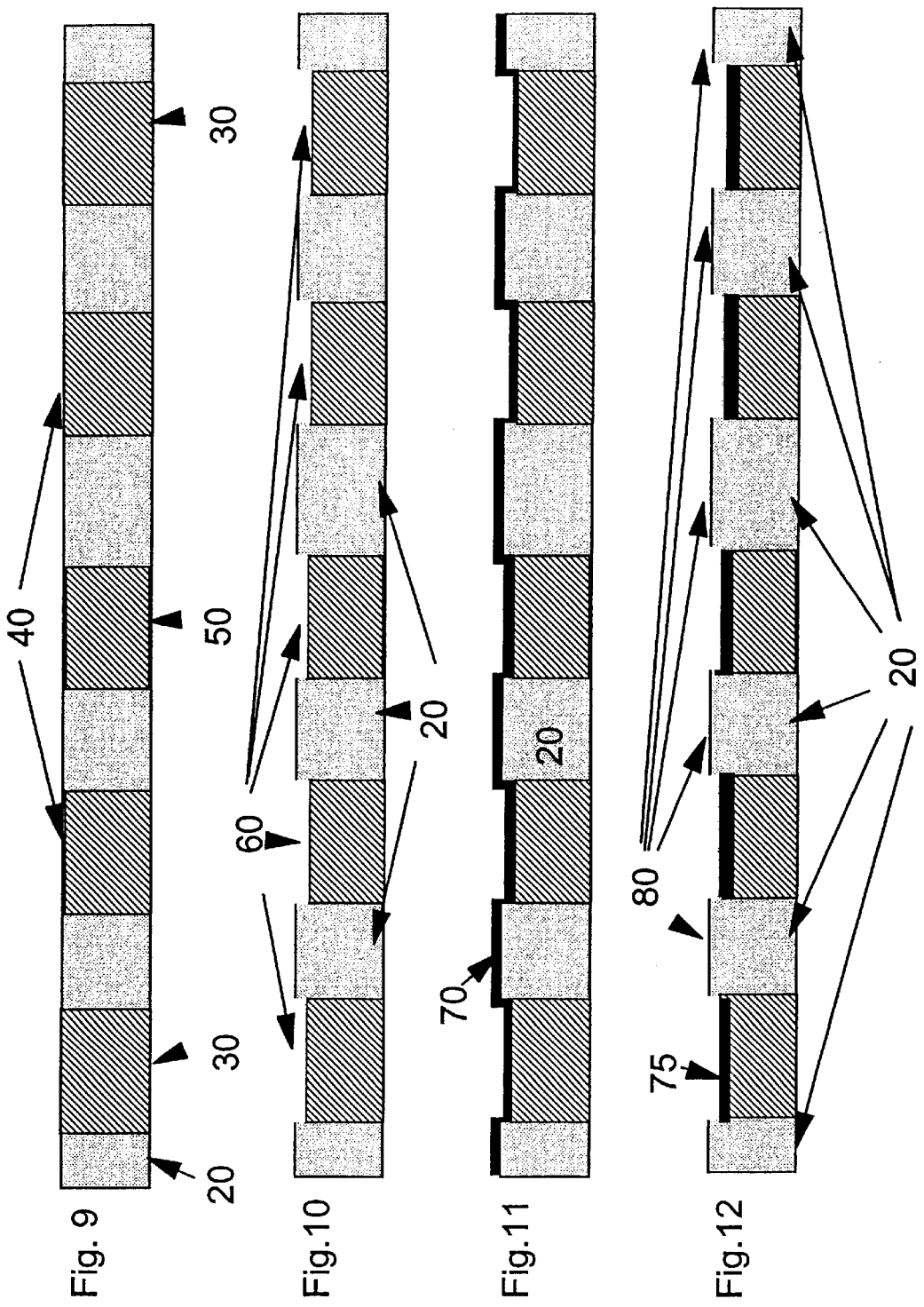

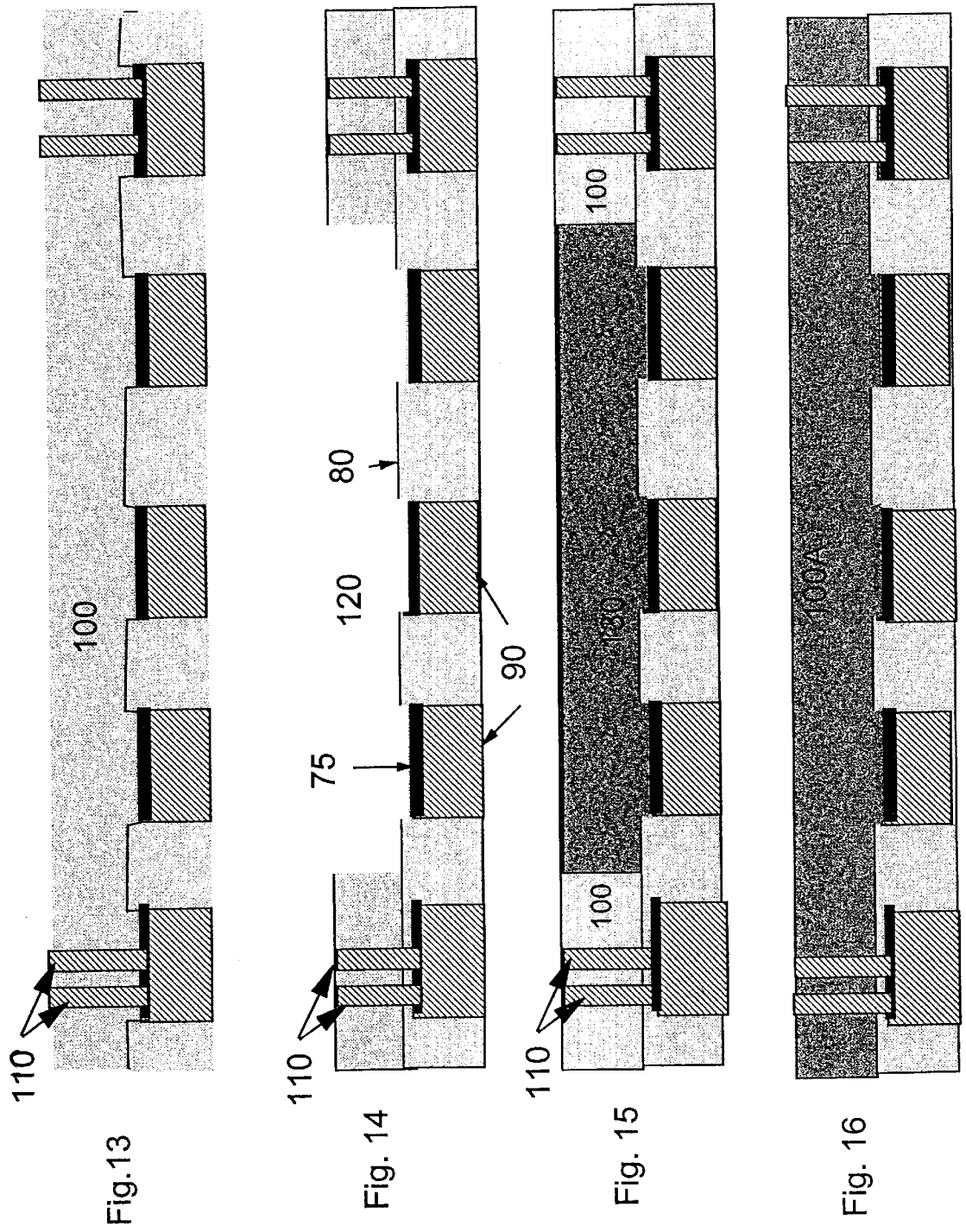

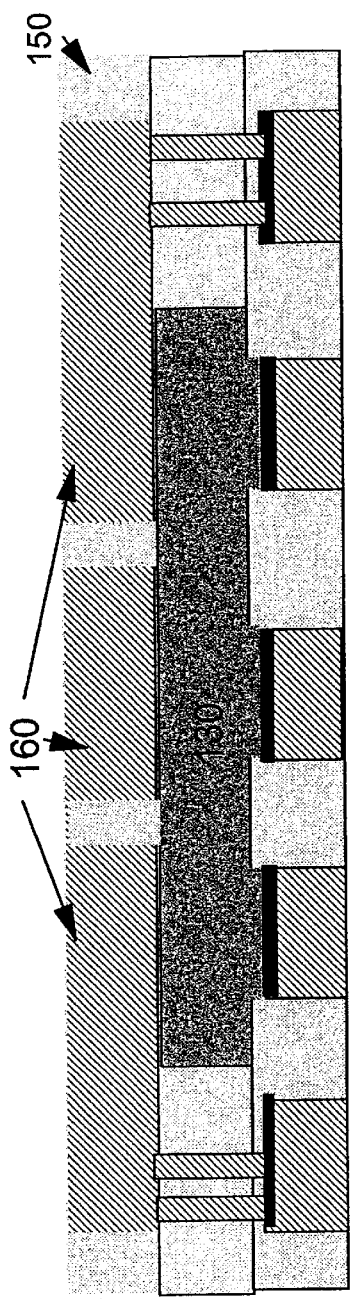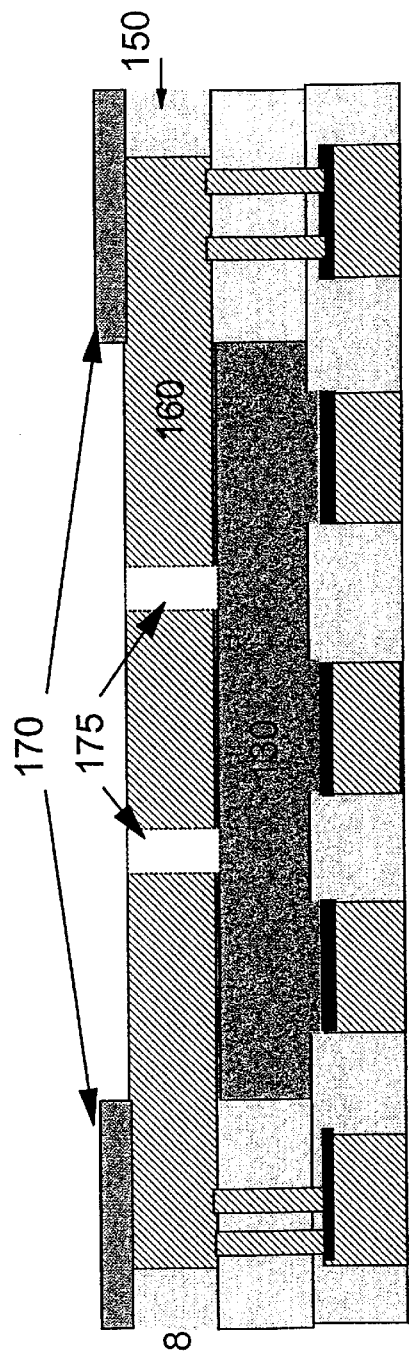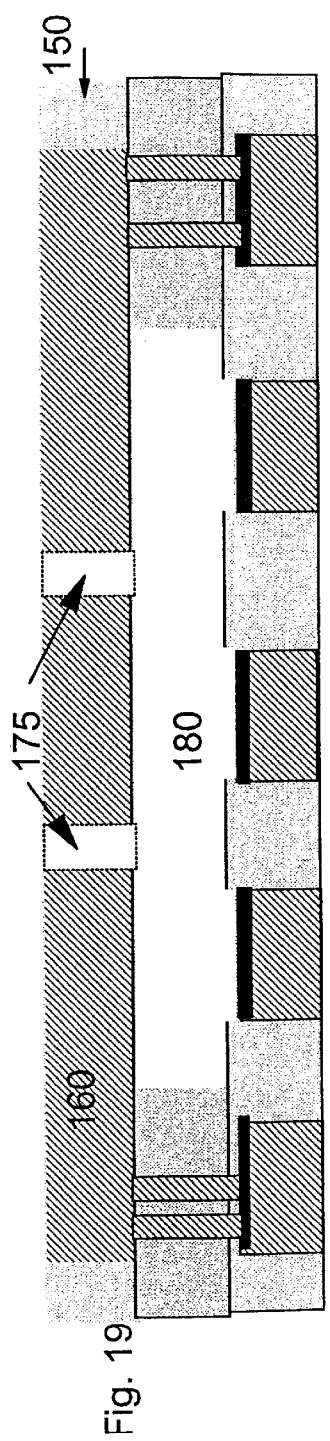

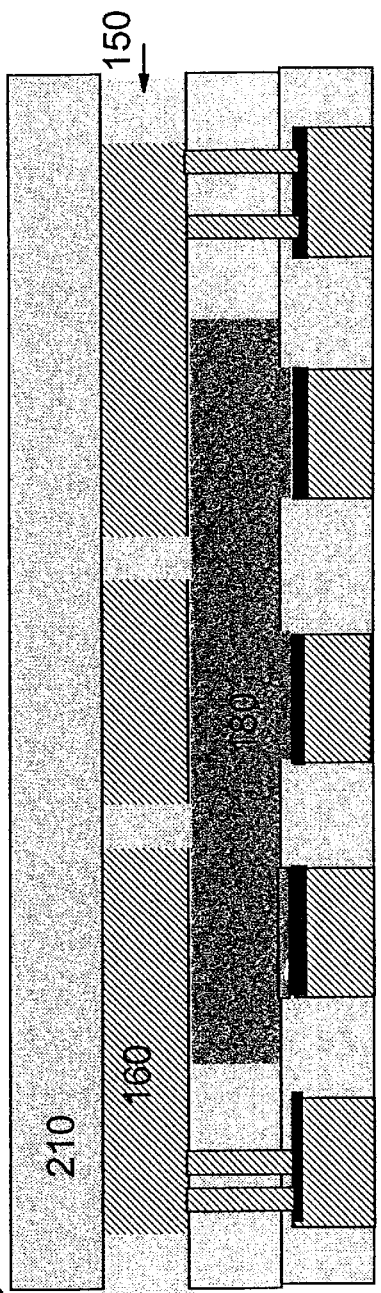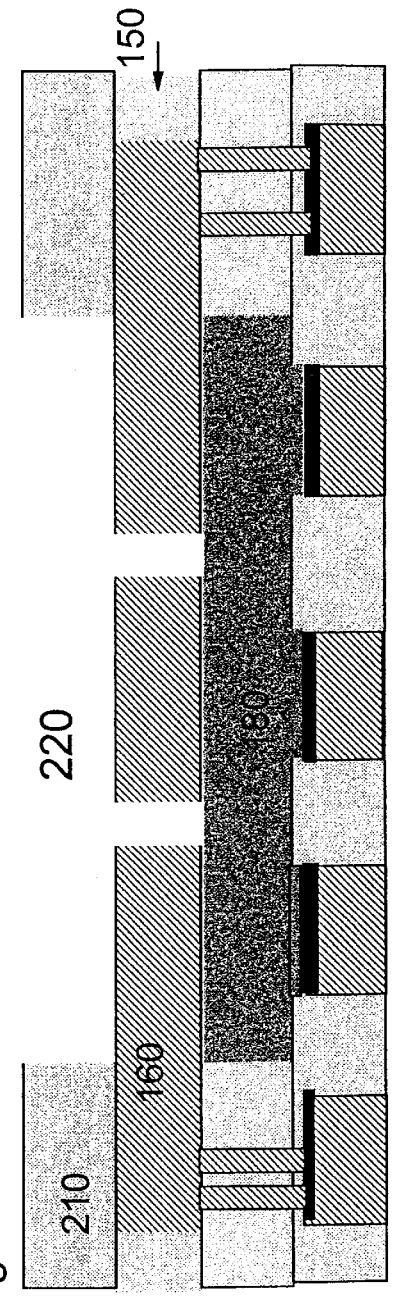

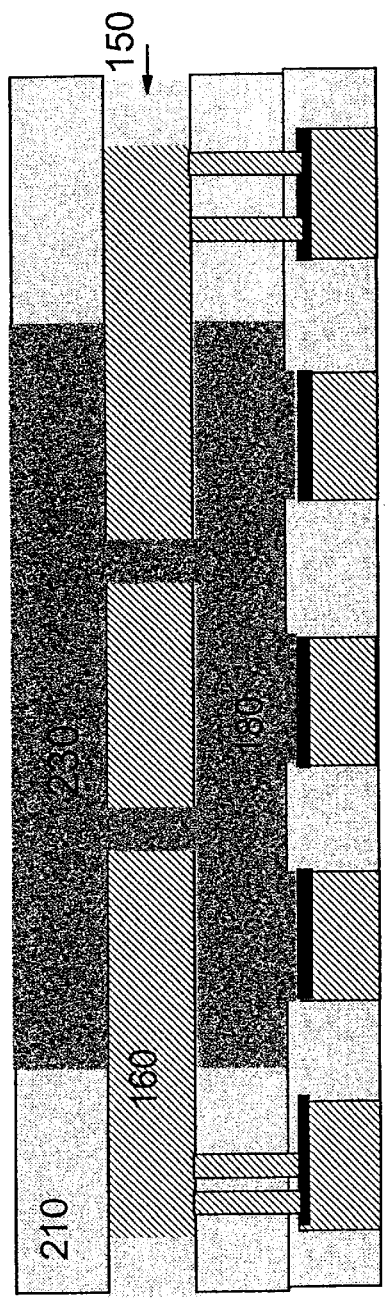
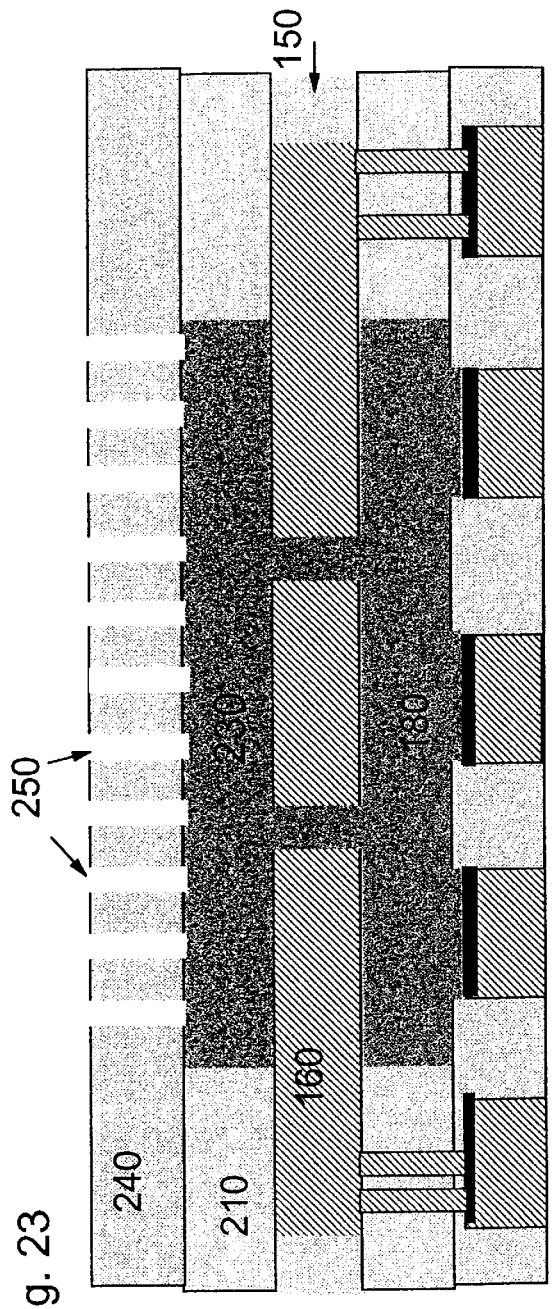

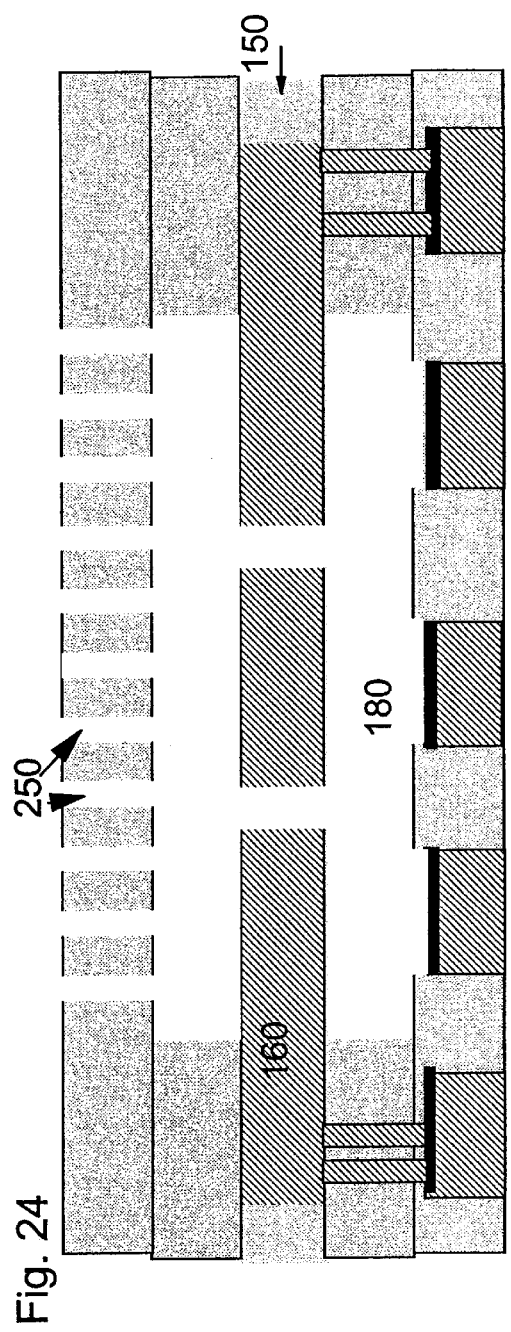
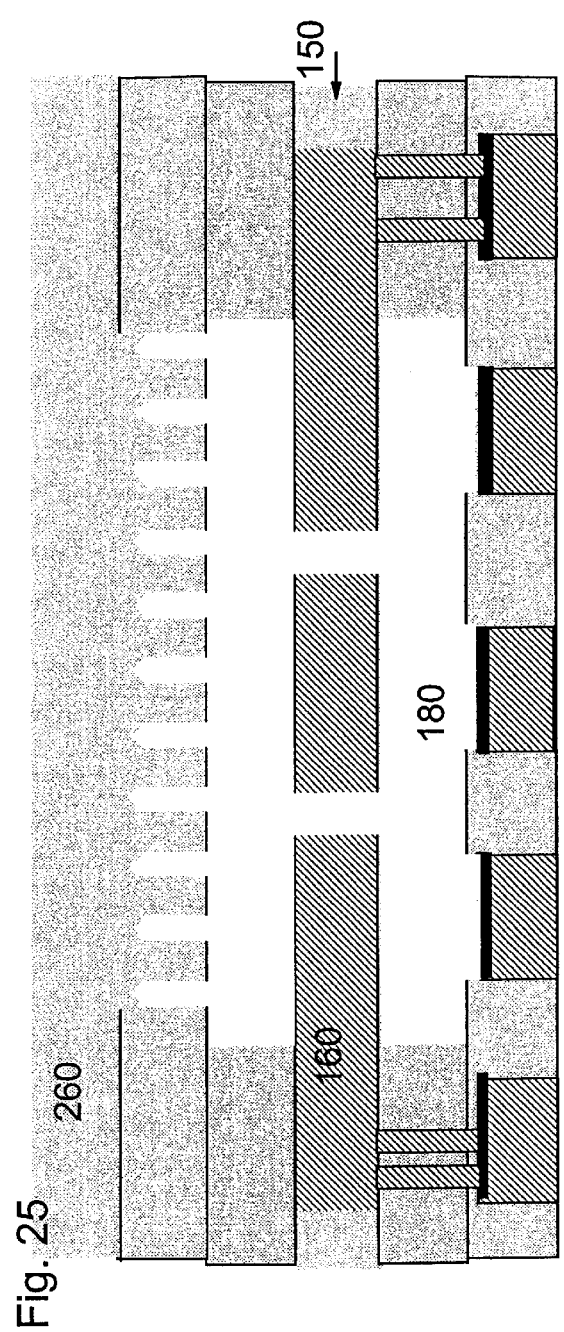
Fig. 24
Fig. 25

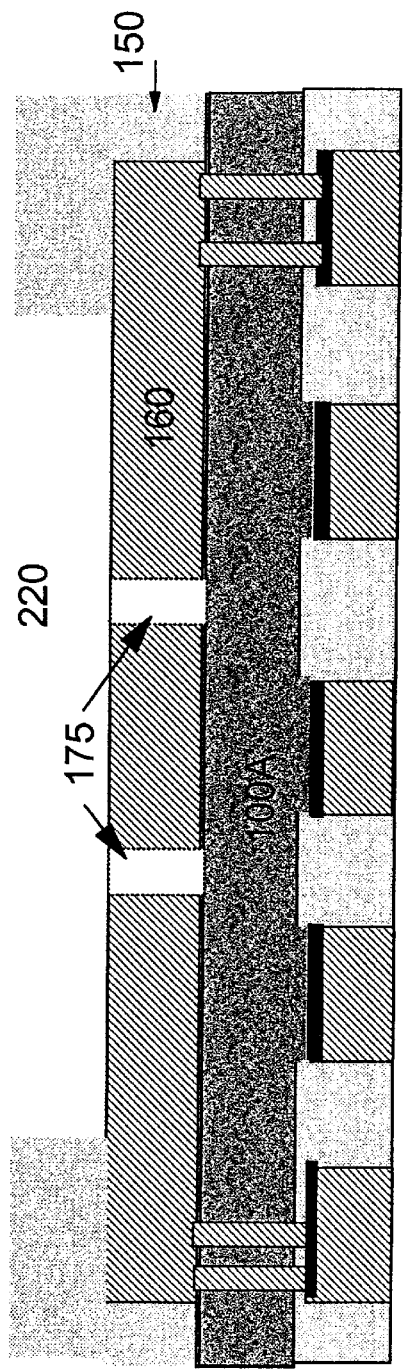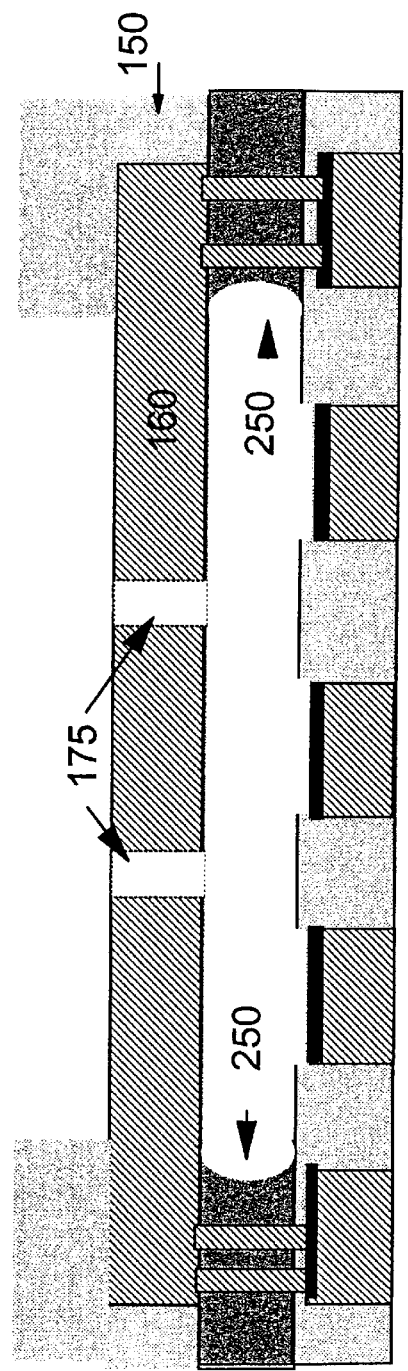

US 6,635,506 B2

METHOD OF FABRICATING MICRO-ELECTROMECHANICAL SWITCHES ON CMOS COMPATIBLE SUBSTRATES

FIELD OF THE INVENTION

This invention generally relates to the fabrication of micro-electromechanical switches (MEMS), and more particularly, to the manufacture of MEMS which can be integrated into current state of the art semiconductor fabrication processes.

BACKGROUND OF THE INVENTION

Switching operations are a fundamental part of many electrical, mechanical and electromechanical applications. MEM switches have drawn considerable interest over the last few years. Products using MEMS technology are widespread in biomedical, aerospace, and communications systems.

Conventional MEMS typically utilize cantilever switches, membrane switches, and tunable capacitor structures as described, e.g., in U.S. Pat. No. 6,160,230 to McMillan et al., U.S. Pat. No. 6,143,997 to Feng et al., U.S. Pat. No. 5,970,315 to Carley et al., and U.S. Pat. No. 5,880,921 to Tham et al. MEMS devices are manufactured using micro-electromechanical techniques and are used to control electrical, mechanical or optical signal flows. Such devices, however, present many problems because their structure and innate material properties require them to be manufactured in lines that are separate from conventional semiconductor processing. This is usually due to the different materials and processes which are not compatible and, therefore, which cannot be integrated in standard semiconductor fabrication processes.

The use of materials typically used in the manufacture of MEMS, such as gold, pose obvious integration problems for integrating devices directly to on-chip applications. Even the use of polysilicon, which is widely found in the literature, poses problems due to the temperature cycles and the usual segregation of front-end of the line (FEOL) tools where the actual semiconductor devices are fabricated and the back-end of the line (BEOL) where interconnect metals are processed. Typically, the two sets are not allowed to have process crossovers from one to the other in order to prevent metallic contamination of the active devices. It is therefore unlikely to see polysilicon deposition in the back-end of the line.

Most existing processes suffer from a serious drawback in that by using standard metalization, no encapsulation is provided to protect the metal. Moreover, more than one substrate is used, oftentimes bonded together, with corresponding inherent disadvantages.

Other existing techniques only provide switching capabilities at the top of the structure, making it unlikely that integration can be achieved at all levels, as will be described hereinafter in the present invention.

Accordingly, there is a need for a process that is capable of providing MEMS devices using established BEOL materials coupled to processing that can be fully integrated so that these devices can be manufactured either in conjunction with or as an add-on module to the conventional BEOL or interconnect levels.

In order to gain a better understanding of the present invention, a conventional MEM switch will now be described with reference to FIG. 1, which shows a cross-section view of a MEM switch having both ends of a deformable beam 1 anchored in dielectric 4. The lowest level consists of a dielectric material 5 containing conductive elements 2, 2a, and 3 which will be used subsequently to connect or form the various electrical portions of the device. The conductors referenced by numerals 2 and 2a are used to provide an operating potential that cause the beam to deform. Conductor 3, which conducts a signal, is in turn connected to the beam when it is in operation.

FIG. 2 shows a planar view of the same prior art MEM device of FIG. 1. In a typical implementation, deformable beam 1 is formed by polysilicon over dielectric 4, e.g., $SiO_2$, and the surrounding material is etched away leaving a raised structure, i.e., the beam suspended above the conductors that were previously formed or which, themselves, are made of polysilicon. Then the device is subjected to electroless plating, usually of gold, that adheres to the polysilicon forming the conductive elements 1, 2, 2a and 3. The switch is operated by providing a potential difference between the beam and electrodes 2 and 2a. This voltage generates an electrostatic attraction which pulls beam 1 in contact with electrode 3, thus closing the switch.

One should note that these are all typically raised structures having a large topography when compared to conventional semiconductor devices. This in itself makes them virtually impossible to integrate into the semiconductor chip fabrication process. These devices are a typically made using surface micro-machining techniques which include building on photoresist or building on a substrate, such as silicon, and then removing a portion of the substrate under the device from the backside of the substrate, again precluding integration with standard semiconductor processing.

FIG. 3 illustrates a cross-section view of another version of a conventional MEM switch, wherein only one end of the beam 1 is anchored within the dielectric 4. All the other parts perform as described in FIG. 1. The same applies with regard to FIG. 4, illustrating a top-down view of the corresponding device illustrated in FIG. 3. In the latter case, the switch is operated by applying a voltage between beam 1 and control electrode 2. This causes the beam to be pulled down into contact with the signal electrode 3. When the voltage is dropped, beam 1 returns to its original position.

Typically, the gap between the beam and the control electrode substantially determines the voltage required to pull down the beam. Most literature describes devices having gaps ranging from 1 to several micrometers. These gaps are large and the voltage required is therefore higher than would be desired for most consumer applications. Reported activation voltages range from around 30 to 75 volts. This is far too high for applications like cell phones which typically operate between 3 to 5 volts. The structure of the present invention operates with gaps ranging from 200 angstroms to several thousand angstroms, producing switches having an activation voltage below 5 volts.

The aforementioned illustrative switch configurations are only some of many possible structures which are known in the art. It is worth noting that MEM switches may also be configured in an arrangement of multiple beams wired in a variety of combinations.

Stiction is of primary concern in MEMS devices. Stiction is defined as two or more surface making contact that will not release without causing some damage to the device. Impingement is a major cause of this phenomena. The present invention addresses this problem in at least one embodiment by providing an air gap 200 when the switch is closed, as will be shown in detail with reference to FIG.

19A. Surface tension is also believed to be another major cause of stiction. That explains why the present invention utilizes dry etches and processes for the release of the moving parts and subsequent processing.

OBJECT OF THE INVENTION

Accordingly, it is an object of the invention to build MEM switches and other similar structures which are fully integrated within CMOS , bipolar or BiCMOS wafers.

It is another object to manufacture MEM switches and other similar structures with a modified damascene process.

It is a further object to build MEM switches and other similar structures utilizing copper encapsulated in a barrier material to protect the metal.

It is yet another object to ensure that the encapsulation can be integrated into BEOL copper at a temperature compatible with such a process.

SUMMARY OF THE INVENTION

These and other objects are addressed by the present invention by providing a method of fabricating MEMS switches integrated with conventional semiconductor interconnect levels, using compatible processes and materials.

The invention described herein provides a method of fabricating a capacitive switch adaptable to produce various configurations used for contact switching and/or metal-dielectric-metal switches.

In a preferred embodiment, the process starts with a copper damascene interconnect layer made of metal conductors inlaid within a dielectric. All or portions of the copper interconnects are recessed to a degree sufficient to provide a capacitive air gap when the switch is closed and, additionally, to provide a space for a protective layer of Ta/TaN, if so desired. The metal structures that are defined within the area specified by the switch act as actuator electrodes to pull down a moveable conductive beam providing one or more paths for the switching signals to traverse. The advantage of such air gap is that the dielectric (air) is not subject to charge storage or trapping that causes reliability and voltage drift problems.

The present invention can be embodied using any number of dielectric materials, such as silicon dioxide or silicon nitride, all of which may advantageously be placed between the lower electrodes and the deformable beam of the capacitive switch.

It is worth noting that instead of recessing the electrodes to provide a gap, one may just add dielectric around and/or on the electrode. A second dielectric layer is then deposited to the desired thickness of the gap formed between the lower electrodes and the moveable beam. Vias are the formed through the second dielectric layer to provide connections between the aforementioned metal interconnect layer and the next metal layer which includes the movable beam. The layer containing the vias is then patterned and etched to provide a cavity area which contains the lower activation electrodes as well as the signal paths. The cavity is then back-filled with sacrificial release material, preferably SiLK, which is a semiconductor dielectric in the form of a polymer resin consisting of gamma-butyrolactone, B-staged polymer and mesitylene. This release material is then made substantially planar, preferably, by way of chemical-mechanical polish (CMP) to align it with the top of the dielectric. It is also possible to planarize the release material by re-imaging the same mask that was used to define the cavity area using the opposite polarity photoresist and then etching the release material from the upper surface to make it substantially co-planar with the dielectric in which the cavity was formed. This provides a planar surface upon which the beam layer can be constructed.

The layer containing the movable beam is similar to other interconnect layers typically used for the fabrication of standard CMOS devices. The beam structure preferably extends, partially or completely, across the cavity area previously defined, such that when the switch is in operation, it provides the desired electrical connections. It should also be noted that holes may be incorporated into the moveable beam. These holes are initially filled with the same dielectric that forms the layer containing the beam. These areas of dielectric within the beam are then etched out to provide greater access to the sacrificial material under the beam and, thus, aiding the release process. Next, the pattern of the cavity area or some subset of the pattern is defined and the dielectric material surrounding the beam is removed, including areas through the holes in the beam, providing access to the underlying release material. At this point the released material can be removed. The switch, suspended over the cavity area is now fully functional.

BRIEF DESCRIPTION OF THE DRAWINGS

The foregoing and other objects, aspects and advantages of the invention will be better understood from the following detailed description of a preferred embodiment of the invention with reference to the accompanying drawings, in which:

FIGS. 1 and 2 respectively show a cross-sectional view and a top-down view seen along the length of the beam of a prior art MEM switch, wherein both ends of the beam are anchored;

FIGS. 7 and 8 show respectively cross-sectional and top-down views of a MEM switch fabricated in accordance with the present invention, wherein only one end of the beam is anchored;

FIGS. 9–19 illustrate the series of steps required to fabricate the MEMS device, in accordance to a preferred embodiment of the invention;

FIGS. 20–25 show an alternate process flow providing a fully encapsulated version of the MEM switch of the preferred embodiment.

FIGS. 26 and 27 illustrate an alternative process of making the cavity and vias dielectric layer entirely out of the release material.

DETAILED DESCRIPTION OF THE INVENTION

The primary embodiment teaches building a MEMS device in a way that may be fully integrated into a standard CMOS, bipolar, BiCMOS or other common semiconductor chip process.

Figure 3:
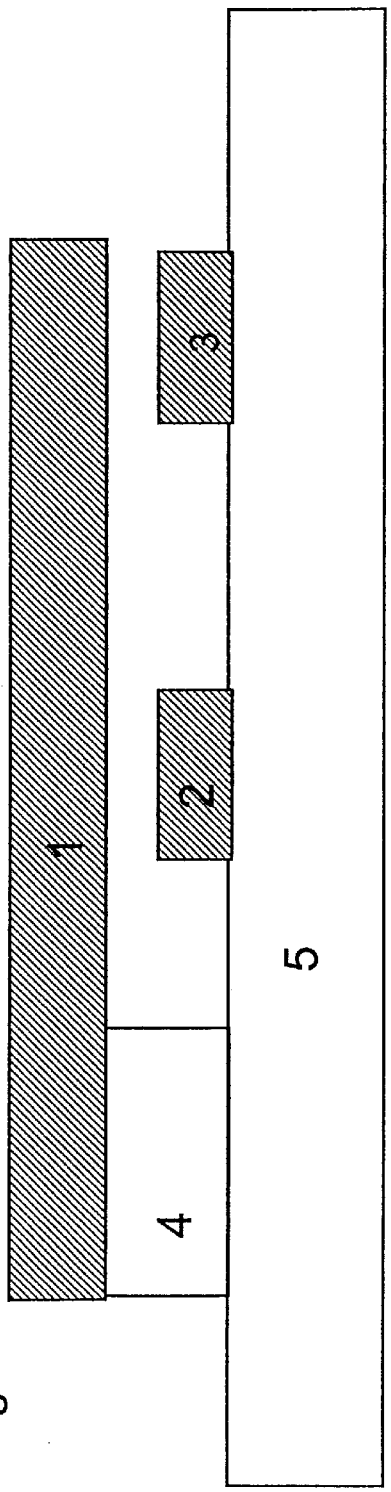
FIGS. 3 and 4 respectively show a cross-sectional and a top-down view of another type of a prior art MEM switch wherein only one end of the beam is anchored.
Figure 4:
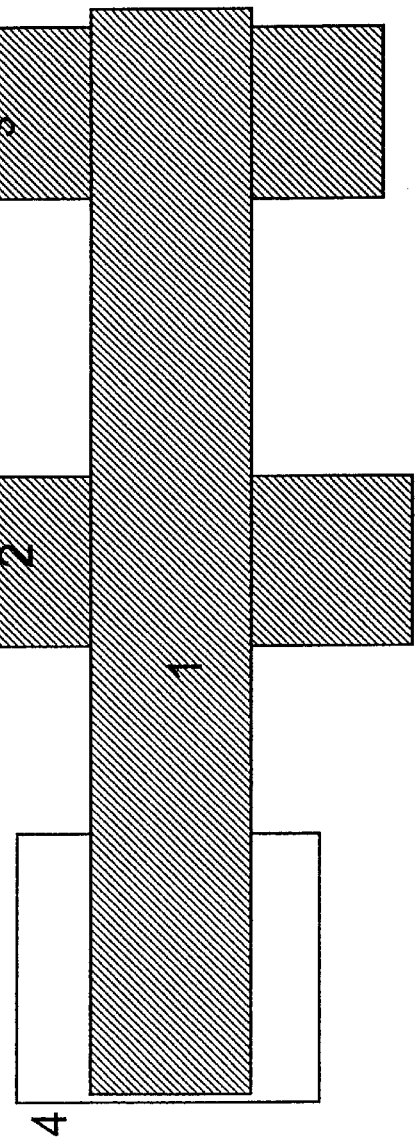
Figure 5:
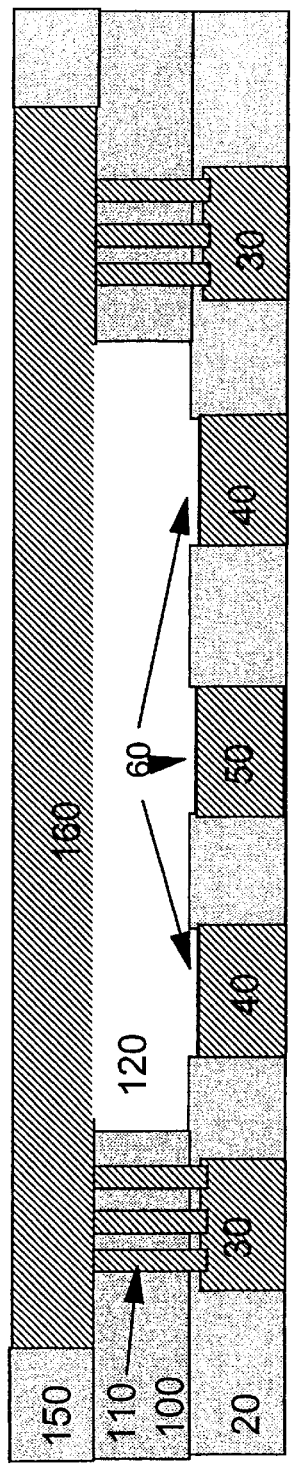
FIGS. 5 and 6 are, respectively, a cross-sectional view and top-down view of a MEM switch fabricated in accordance with the present invention, with both ends of the beam anchored.

FIG. 5 illustrates the initial structure, i.e., a copper damascene interconnect layer. Underlying this, may be placed devices such as FETs, NPN transistors or HBTs (Heterojunction Bipolar Transistors), resistors, etc., on a silicon substrate or, alternatively, on a low-loss substrate, preferably made of $SiO_2$. It consists of copper wiring 30, 40 and 50, embedded within dielectric layer 20, preferably made of $SiO_2$. The area referenced by numeral 30 represents the landing metal for vias 110 embedded in dielectric layer 100. The metal referenced by numeral 40 forms the actuator or control electrodes, and metal 50 represents the signal electrode. The thickness of the metal is typically on the order of 3000 to 5000 Angstroms, but it is not limited to this range. The beam 160, formed within dielectric layer 150, is shown anchored at both ends. The center of the beam is designed to move vertically over cavity 120 (see FIG. 19A).

Still referring to FIG. 5, the top surface 60 of the copper wiring 30, 40 and 50 is shown to be recessed to minimize stiction, preferably by way of a wet etch, although other means are suitable. The extent of the recess depends upon the final structure desired. In the preferred embodiment, a wet etch consisting of a dilute solution of acetic acid and hydrogen peroxide is generally used. The copper is preferably etched to a depth of about 800 Angstroms.

Figure 6:
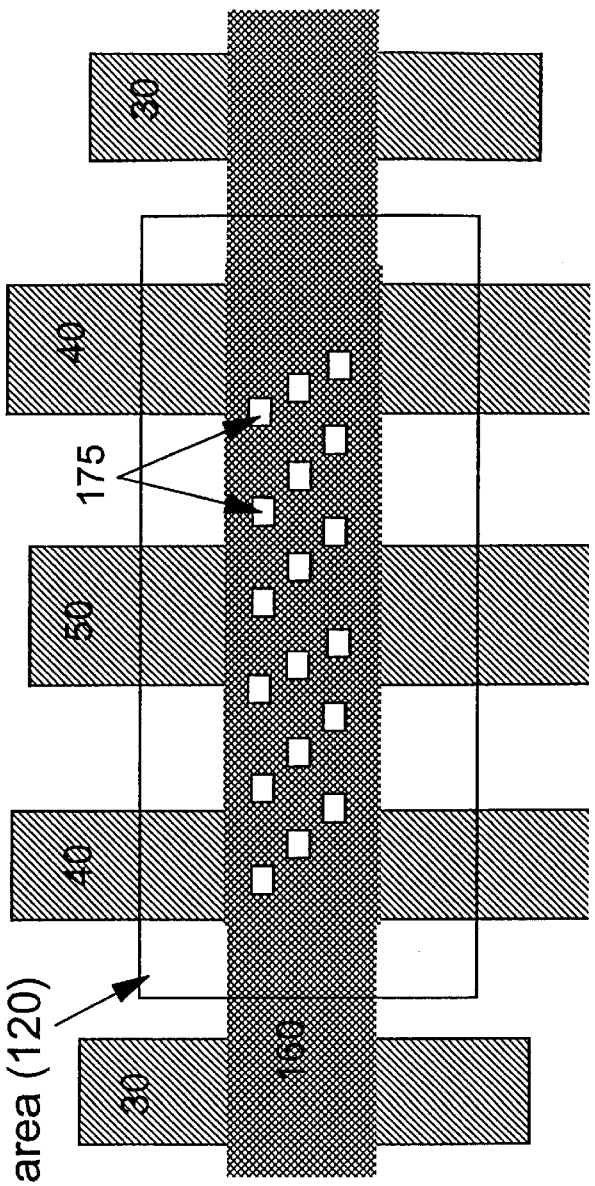

FIG. 6 shows a top-down view of the MEMS device illustrated in FIG. 5. Beam 160, suspended over the cavity 120, is shown having a plurality of holes 175 which will be described in more detail during the process description (FIGS. 9–19). These holes are useful to facilitate the removal of the sacrificial material when constructing the cavity 120.

FIG. 7 shows a cross-section view of another type of MEMS device, wherein only one end of the switch is anchored. As in FIG. 5, copper wiring 30, 40 and 50 are formed in dielectric layer 20, whereas vias 110 are formed in dielectric layer 100. Beam 160 is unattached at one end, allowing it to freely move in a vertical motion over cavity 120.

FIG. 8 is a corresponding top-down view of the MES device described in FIG. 7, again with moveable beam 160 being provided with holes 175.

The process used to construct the MEM switches illustrated in FIGS. 5–6 and 7–8 will now be described in detail.

Referring to FIG. 9, there is shown the copper wiring 30, 40, and 50 formed in dielectric layer 20, wherein the top surface of the wiring is substantially planar with respect to the top surface of dielectric layer 20.

Next, and with reference to FIG. 10, the top surface 60 of the wiring is shown recessed with respect to the top layer of dielectric layer 20. One method for recessing the metal is by way of a wet etch which is efficacious for that metal for the time required to achieve the desired depth. For instance, in the preferred embodiment, a solution consisting of water, acetic acid and hydrogen peroxide (3 liters, 15 ml and 9 ml, respectively) applied for 2.5 minutes achieves a depth of 600 to 800 Angstroms.

Referring now to FIG. 11, a layer of barrier material 70 is deposited to encapsulate the copper to protect it for the subsequent processing. The preferred embodiment incorporates a layer 100 Angstroms thick of Ta followed by 400 Angstroms of TaN. Alternatively, the barrier material can also be made of dielectric or of any number of other suitable metallic barriers.

FIG. 12 shows the result of removing the barrier 70 from the uppermost surface of dielectric 80. This is best accomplished by a chemical-mechanical polish (CMP). The barrier material 75 is now left only in the recessed areas. Since the CMP process may erode some of the dielectric 20, care must be taken to minimize erosion of the dielectric if one is to maintain a suitable gap 200 when the switch is closed. When the CMP process is completed, the depth from the upper dielectric 80 down to the barrier 75 will be about 200 Angstroms. This can be customized in order to form the final gap for the capacitive switch.

Another method of encapsulating the conductors is to pattern the blanket barrier 70 with the same mask that defined the conductors, but with an opposite polarity photoresist, and etching the barrier layer from the uppermost surface.

In a variation to the preferred embodiment, and referring to any of FIGS. 5 through 8, one may modify the recess and/or the depositions to achieve a planar or even a raised metal contact to fabricate a metal-to-metal contact switch or a metal-insulator-metal switch. In the case of a metal contact switch, one may encapsulate the lower electrode(s), especially 50, to a level that is substantially planar with dielectric 20 or even slightly raised above that surface. In this configuration, when the switch is closed, a direct metal-to-metal contact is established between signal electrode 50 and beam 160. Similarly, the lower electrodes can be encapsulated with dielectric material, preferably, one having a high dielectric constant, in order to construct a metal-insulator-metal switch. This generates a capacitive switch similar to the preferred air gap switch without the advantages of the reduced contact area.

Referring now to FIG. 13, the addition of another dielectric layer 100 is shown within which vias are fabricated using standard processing techniques. The thickness of dielectric layer 100 depends on the required spacing between the lower electrodes and the upper beam to be formed later. In the preferred embodiment, dielectric 100 is about 1000 Angstroms thick. Vias 110 are patterned, etched, filled and planarized according to standard damascene processing.

FIG. 14 shows the formation of cavity 120 etched in dielectric 100. This cavity is fabricated using conventional photolithography and reactive-ion-etching (RIE). Care must be taken to ensure that the original structure of the lower electrodes 90 is preserved, i.e., ensuring that the relationship between the lower dielectric surface 80 and the recessed metal 75 is not altered. This relationship is not critical when constructing the metal-to-metal or metal-insulator- metal versions of the MEMS device.

FIG. 15 illustrates the structure after applying a sacrificial material 130, such as SiLK or DLC. [Note: SILK is a semiconductor dielectric manufactured by Dow Chemical Corp. This material includes various formulations of the product, known also under the name of Porous SiLK. It is a polymer resin comprised of gamma-butyrolactone, B-staged polymer and mesitylene. Another material which is preferentially used is the aforementioned DLC, a diamond like carbon, which is an amorphous carbon containing a coating wherein a proportion of the carbon atoms is bonded in a similar manner to diamond and which resembles in many ways to diamond. Other organic materials that are capable of being volatized in a similar manner will be described. Diamond-like carbon is produced when carbon is deposited under energetic bombardment. The instantaneous localized high temperature and pressure induce a proportion of the carbon atoms to bond as diamond. These conditions are obtained during plasma assisted chemical vapor deposition (PACVD). The deposition is done with carbon containing gas, such as acetylene, which is introduced to provide the energetic carbon ions. These materials can be removed by way of oxygen plasma exposure if there is no oxidizable material that is exposed. If there is an oxidizable material that will be exposed during the removal of the organic material, then an $H_2/CO_2/CO/N_2$ type plasma removal is to be used. These gas mixtures will be recognizable to practitioners skilled in the art of reactive-ion-etch processes. The structure is finally planarized to an extent where it is substantially aligned with respect to the upper surface of dielectric 100.

In another embodiment of the invention, shown in FIG. 16, the entire dielectric layer 100 is formed of release material 100A, such as SiLK. This allows eliminating the steps of forming the bottom cavity 120 (see FIG. 14) since the area evacuated can be defined later, as will be shown in FIGS. 26 and 27. The edges of the cavity are defined by the lateral removal of the release material. The material is released by exposing it to an oxygen or hydrogen plasma which decomposes the material. Additional details may be found in the paper "Erosion of diamond films and graphite in oxygen plasma" by A. Joshi and R. Nimmagadda, published in the Journal of Materials Research., Vol. 6, No. 7, p. 1484, 1996, by the Materials Research Society.

FIG. 17 illustrates the formation of the level reserved for beam 160. To this end, it may be useful to refer back to FIGS. 5–8 for better understanding the structure. At the beam level, dielectric material 150 is again deposited. The metal beam 160 is preferably fabricated within dielectric 150. The beam may be fixed at both ends, as shown in FIGS. 5–6, or at one end as illustrated with reference to FIGS. 7–8. As previously mentioned, the beam may be provided with holes 175 which are useful to subsequently facilitate the removal of the sacrificial material. The beam may also be encapsulated as described earlier with reference to FIGS. 11–12, referenced by numeral 75, in order to protect the copper.

FIG. 18 illustrates the photolithography and REE steps to etch out the dielectric around and through the beam and over the cavity. This frees the moveable section of the beam 160 from the upper dielectric 150 and provides access to release material 130.

FIG. 19 illustrates the structure after removal of the release material 130. This is preferably done using an oxygen plasma to break down the organic materials that are present, allowing them to be evacuated. Following this step, encapsulation of the entire device may be performed using conventional methods or, alternatively, by pinching off the release holes in a dielectric covering, as will be described hereinafter with reference to FIGS. 22–25.

Figure 19A:
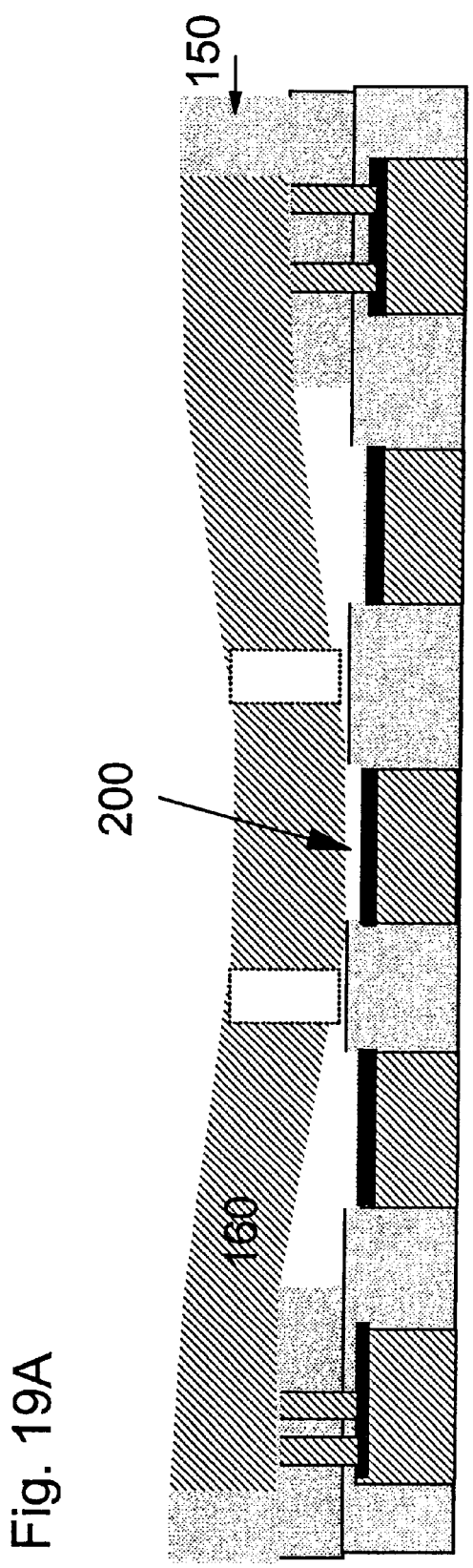
FIG. 19A shows the completed MEM switch, according to the invention, in its closed position.

FIG. 19A depicts the completed device in its closed state. Beam 160, anchored at both ends, is shown with its center bent downwards. The drawings are not to scale. Accordingly, in order to better visualize the final device and better understand its working, the true scale of the various parts of the device will be described. For example, the cavity that defines the distance the beam is to move, may only be 200 to 1000 Angstroms for a moveable beam 10,000 Angstroms thick. Thus, the deformation of the beam is fairly minor.

FIGS. 20 through 23 shows an alternate method to be inserted from FIG. 17 onward and which is useful to describe how to encapsulate the MEMS device. Referring to FIG. 20, yet another dielectric layer 210 is now added to form another cavity above the beam 220 (see FIG. 21). When etching the upper cavity 220, the dielectric is removed from the cavity area through and surrounding the beam.

Next, in FIG. 22 the etched areas are filled with more release material 230 as previously described, preferably, with SiLK or DLC, and it is planarized. The same sacrificial material that was placed below is now used again, such that the release process removes all the layers of release material.

FIG. 23 illustrates the addition of yet another dielectric layer 240 within which vias 250 are patterned and etched. These vias provide access to the release material to be removed.

FIG. 24 shows the device with the release material removed through vias 250, as described earlier.

FIG. 25 shows the final encapsulation step of depositing another dielectric 260 which pinches off the small vias 250, thus sealing the structure.

FIG. 26 and 27 illustrate an alternate method of making the cavity/vias dielectric layer entirely out of release material 100A, as referenced in FIG. 16. FIG. 26 shows the beam already formed and the upper cavity area 220 patterned and etched, as described earlier with reference to FIG. 21.

Next, the release process using the plasma process is shown in FIG. 27. The release process is isotropic and, thus, has a lateral removal rate. The lateral rate depends on the release material used and the process by which it is removed. The release material is removed directly below the open areas as well as at some lateral distance 250 from each boundary.

While the invention has been described in conjunction with a preferred embodiment, it is to be understood that many alternatives, modifications and variations will be apparent to those skilled in the art in light of the aforementioned description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A method of fabricating a micro-electromechanical (MEM) switch comprising the steps of:
   a) depositing a first dielectric layer on a substrate, said first dielectric layer having a plurality of conductive interconnect lines formed therein;
   b) depositing a second dielectric layer through which conductive vias are formed, said vias contacting at least one of said plurality of conductive interconnect lines;
   c) forming a cavity that is carved out from said second dielectric layer;
   d) filling said cavity with sacrificial material and planarizing said sacrificial material; and
   e) depositing a third dielectric layer and forming a conductive beam, having said conductive vias contact said conductive beam.

2. The method as recited in claim 1, further comprising the steps of:
   f) depositing a fourth dielectric layer and patterning a second cavity conforming to said first cavity;
   g) filling said second cavity with sacrificial material and planarizing said sacrificial material
   h) depositing a fifth layer to cover said second cavity;
   i) patterning and etching a plurality of holes over said sacrificial material; and
   j) selectively removing said sacrificial material such that said conductive beam is anchored at at least one end, and leaving the remainder of said conductive beam surrounded by air.

3. The method as recited in claim 2, further comprising the step of adding a sixth dielectric layer to seal said second cavity to protect exposed portions of said conductive beam and to close off released vias in said fifth dielectric layer.

4. The method as recited in claim 3, wherein said protective layer is made of Ta or TaN.

5. The method as recited in claim 1, wherein said step e) is replaced by the step of selectively removing the sacrificial material from said second dielectric layer, said selective removal conforming to the shape of said first cavity.

6. The method as recited in claim 1, wherein said cavity is formed by selectively removing dielectric material from about said conductive beam.

7. The method as recited in claim 1, wherein said step e) is replaced by the step of e1) patterning the third dielectric layer to selectively free said conductive beam from said third dielectric layer; and e2) removing said sacrificial material within said second dielectric layer.

8. The method as recited in claim 1, wherein said conductive interconnect lines are made of copper, and wherein said conductive interconnect lines are inlaid in a dielectric.

9. The method as recited in claim 8, wherein all or portions of said copper interconnect lines are recessed to a degree sufficient to provide a capacitive air gap when said MEM switch is in a closed state.

10. The method as recited in claim 1, wherein said conductive lines are recessed with respect to a top surface of said first dielectric layer to minimize stiction effects.

11. The method as recited in claim 10, further comprising the step of encapsulating said recessed conductive lines.

12. The method as recited in claim 2, wherein said conductive beam is anchored at one or at two of its ends.

13. The method as recited in claim 1, wherein said MEM switch is coupled to a plurality of other metal-dielectric-metal switches that are arranged in a variety of configurations.

14. The method as recited in claim 1, wherein said conductive lines formed in an exposed area of said first cavity act as actuator electrodes for pulling down said conductive beam and provide one or more electrical signal paths.

15. The method as recited in claim 1, wherein said second dielectric layer is deposited to a thickness that is determined by the size of the gap to be formed between said plurality of conductive interconnect lines acting as a lower electrode and said conductive beam.

* * * * *